United States Patent
Zong

(10) Patent No.: US 12,305,070 B2
(45) Date of Patent: May 20, 2025

(54) PROTECTIVE COATING AND PREPARATION METHOD THEREFOR

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 257 days.

(21) Appl. No.: 18/008,663

(22) PCT Filed: May 21, 2021

(86) PCT No.: PCT/CN2021/095010
§ 371 (c)(1),
(2) Date: Dec. 6, 2022

(87) PCT Pub. No.: WO2021/249156
PCT Pub. Date: Dec. 16, 2021

(65) Prior Publication Data
US 2023/0242788 A1   Aug. 3, 2023

(30) Foreign Application Priority Data

Jun. 9, 2020  (CN) .......................... 202010519596.1
Jun. 9, 2020  (CN) .......................... 202010520210.9

(51) Int. Cl.
*C09D 183/04*  (2006.01)
*C09D 4/00*  (2006.01)
*C09D 133/16*  (2006.01)

(52) U.S. Cl.
CPC ............. *C09D 183/04* (2013.01); *C09D 4/00* (2013.01); *C09D 133/16* (2013.01)

(58) Field of Classification Search
None
See application file for complete search history.

(56) References Cited

U.S. PATENT DOCUMENTS

| | | | |
|---|---|---|---|
| 2007/0202270 A1 | 8/2007 | Rose et al. | |
| 2012/0003500 A1 | 1/2012 | Yoshida et al. | |
| 2012/0308762 A1 | 12/2012 | Legein et al. | |
| 2013/0040102 A1* | 2/2013 | Gleason | B05D 7/52 |
| | | | 428/141 |
| 2013/0313480 A1 | 11/2013 | Dubreuil | |
| 2016/0083613 A1 | 3/2016 | Wright et al. | |

FOREIGN PATENT DOCUMENTS

| | | |
|---|---|---|
| CN | 1468154 | 1/2004 |
| CN | 101048533 | 10/2007 |
| CN | 102317496 | 1/2012 |
| CN | 106916331 | 7/2017 |
| CN | 107523809 | 12/2017 |
| CN | 107587120 | 1/2018 |
| CN | 110158060 | 8/2019 |
| CN | 111519168 | 8/2020 |
| CN | 111675966 | 9/2020 |
| EP | 3611291 A1 | 2/2020 |
| WO | WO 2010/093041 A1 | 8/2010 |

OTHER PUBLICATIONS

PCT International Search Report and Written Opinion issued in International Application No. PCT/USCN2021/095010, dated Jul. 21, 2021. {English Translation}.
Extended European Search Report issued in European Patent Application No. EP21821751.1, dated Jul. 2, 2024.
Office issued in Korean Patent Application No. 10-2023-7000725, dated Nov. 23, 2024.

* cited by examiner

*Primary Examiner* — Ramsey Zacharia
(74) *Attorney, Agent, or Firm* — Parker Highlander PLLC

(57) ABSTRACT

A protective coating is provided, including a first coating formed on a surface of a substrate by plasma polymerization deposition when the substrate contacts plasmas. The plasmas include a plasma of a monomer A and a plasma of a monomer B, wherein the monomer A includes both a silicon structural unit of formula (I) and at least one amine group structural unit of formula (II) or formula (III); and monomer B includes a terminal carboxyl group structural unit. Further disclosed is a preparation method of the protective coating, the method includes: providing a substrate, gasifying monomers including the monomer A and the monomer B and then introducing the monomers into a plasma reactor, performing a plasma discharge, and forming the first coating on the surface of the substrate by plasma polymerization. Further disclosed is a device, which is provided with the protective coating on at least part of the surface thereof.

20 Claims, No Drawings

PROTECTIVE COATING AND PREPARATION METHOD THEREFOR

CROSS-REFERENCE TO RELATED APPLICATIONS

This application is a National Stage of International Application No. PCT/CN2021/095010, filed on May 21, 2021, which claims the priority to Chinese Patent Application No. 202010519596.1, filed on Jun. 9, 2020, and entitled "PROTECTIVE COATING AND PREPARATION METHOD THEREFOR", and to Chinese Patent Application No. 202010520210.9, filed on Jun. 9, 2020, and entitled "PROTECTIVE COATING AND PREPARATION METHOD THEREFOR", the contents of which are incorporated herein by reference in their entirety.

TECHNICAL FIELD

The present disclosure relates to the field of plasma chemistry, and more particularly, to a plasma polymerization protective coating and a preparation method therefor.

BACKGROUND

Organic polymer coatings can effectively protect surfaces of different materials. For example, electronic and electrical components, metals, and other products are easily corroded and short circuited due to the erosion of water vapor, liquid. Polymer protective coatings can prevent the erosion of liquid, thereby the stability and reliability of electronic products, metal products and other products in damp or underwater can be improved. Conventionally, the vapor deposition method is the mainstream method for preparing polymer protective coatings on surfaces of substrates, and is economical, practical and easy to operate. In particular, the plasma chemical vapor deposition uses plasma to activate reaction monomer gas to deposit on a surface of a substrate. The plasma chemical vapor deposition process is applicable to various substrates, and deposits a uniform polymer protective coating, at a low coating preparation temperature, and with a thin coating thickness of a small stress, almost no damage to the substrate surface, and almost no effect on the substrate performance. In the plasma preparation of polymer protective coatings, fluorocarbon resin protective coatings are usually prepared by fluorinated compound as monomers on the surface of the substrate. For this fluorocarbon resin protective coating, there is a problem of poor adhesion between the coating and the substrate. When the surface of the protective coating is subject to external friction, it is easy to be scuffed, thus losing its protection function. Therefore, how to improve the adhesion between the protective coating and the substrate to make the protective coating firmly adhere to the surface of the substrate so as to improve the wear resistance of the protective coating is one of the important directions for the optimization and improvement of the protective coating.

SUMMARY

In order to solve problems of poor adhesion between a protective coating and a substrate and poor wear resistance, the specific embodiment of the present disclosure provides a protective coating and a preparation method therefor, as illustrated in the following:

A protective coating includes a first coating formed on a surface of a substrate by plasma polymerization deposition when the substrate contacts plasmas, and the plasmas include a plasma of a monomer A and a plasma of a monomer B, wherein the monomer A includes a silicon structural unit of formula (I) and at least one amine group structural unit of formula (II) or formula (III), and the monomer B includes terminal carboxyl group structural unit.

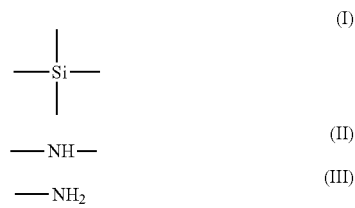

Optionally, the structure of the monomer A is shown in formula (IV),

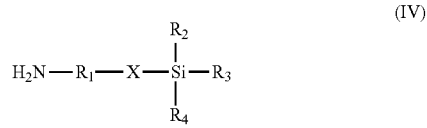

wherein X is a connecting bond, an oxygen atom or a carbonyl, $R_1$ is a $C_1$-$C_{10}$ hydrocarbylene or a halogen-substituted $C_1$-$C_{10}$ hydrocarbylene, and $R_2$, $R_3$ and $R_4$ are respectively independently selected from a group consisting of a hydrogen atom, a halogen atom, a $C_1$-$C_{10}$ hydrocarbyl, a halogen-substituted $C_1$-$C_{10}$ hydrocarbyl, a $C_1$-$C_{10}$ hydrocarbyloxy, a halogen-substituted $C_1$-$C_{10}$ hydrocarbyloxy, a $C_1$-$C_{10}$ hydrocarbon acyloxy, and a halogen-substituted $C_1$-$C_{10}$ hydrocarbon acyloxy.

Optionally, X is a connecting bond, $R_1$ is a $C_1$-$C_{10}$ alkylene, and $R_2$, $R_3$ and $R_4$ are respectively independently a $C_1$-$C_{10}$ hydrocarbyloxy.

Optionally, $R_1$ is an ethylidene, a propylidene or a butylidene, $R_2$, $R_3$ and $R_4$ are respectively independently a methoxy, an ethoxy or a propoxy.

Optionally, the structure of the monomer B is shown in formula (V),

wherein $R_5$, $R_6$ and $R_7$ are respectively independently selected from a group consisting of a hydrogen atom, a halogen atom, a $C_1$-$C_{10}$ hydrocarbyl, and a halogen-substituted $C_1$-$C_{10}$ hydrocarbyl, and Y is a connecting bond, a $C_1$-$C_{10}$ hydrocarbylene or a halogen-substituted $C_1$-$C_{10}$ hydrocarbylene.

Optionally, $R_5$, $R_6$ and $R_7$ are respectively independently selected from a group consisting of a hydrogen atom and a methyl, and Y is a connecting bond.

Optionally, $R_5$ and $R_6$ are hydrogen atoms, and $R_7$ is a hydrogen atom or a methyl.

Optionally, the substrate is an electronic or electrical component or a metal.

Optionally, the molar ratio of the monomer A calculated by the amine group structural unit to the monomer B calculated by the terminal carboxyl group structural unit is in a range of 10:0.1 to 1:10.

Optionally, the molar ratio of the monomer A calculated by the amine group structural unit to the monomer B calculated by the terminal carboxyl group structural unit is in a range of 10:0.5 to 1:5.

Optionally, the plasmas also include a plasma of a monomer C, and the monomer C includes one or more selected from a group consisting of a fluorohydrocarbon, a fluoroacrylate and a fluorosilane.

Optionally, the molar ratio of the sum of the monomer A and the monomer B to the monomer C is in a range of 1:20 to 20:1.

Optionally, the molar ratio of the sum of the monomer A and the monomer B to the monomer C is in a range of 1:5 to 5:1.

Optionally, the protective coating further includes a second coating on the first coating, the second coating includes one or more layers of plasma polymerization coatings, and monomers of each layer of the second coating are respectively independently one or more selected from a group consisting of a fluorohydrocarbon, a fluoroacrylate and a fluorosilane.

Optionally, the second coating includes two or more layers of plasma polymerization coatings, wherein the fluorine atom content of the monomers of an outer layer of plasma polymerization coating is higher than the fluorine atom content of the monomers of an inner layer of plasma polymerization coating.

Optionally, the fluorohydrocarbon includes one or more selected from a group consisting of a fluoroalkane, a fluoroalkene and a fluoroalkyne.

Optionally, the structure of the fluoroacrylate is shown in formula (VI),

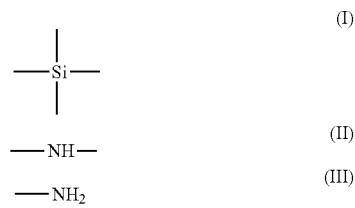

(VI)

wherein $R_8$, $R_9$ and $R_{10}$ are respectively independently selected from a group consisting of a hydrogen atom, a halogen atom, a $C_1$-$C_{10}$ hydrocarbyl, and a halogen-substituted $C_1$-$C_{10}$ hydrocarbyl, x is an integer ranging from 0 to 2, and y is an integer ranging from 1 to 20.

Optionally, $R_8$, $R_9$ and $R_{10}$ are respectively independently selected from a group consisting of a hydrogen atom and a methyl.

Optionally, the thickness of the protective coating ranges from 1 nm to 1000 nm.

A preparation method of the aforementioned protective coating includes: providing a substrate; and gasifying the monomers including the monomer A and the monomer B and introducing the monomers into a plasma reactor, performing a plasma discharge, and forming the first coating on the surface of the substrate by plasma polymerization.

Optionally, the monomer A and the monomer B are mixed before gasification.

Optionally, the preparation method further includes: forming a second coating by plasma polymerization on the first coating formed by plasma polymerization of the monomer A and the monomer B.

Optionally, the plasma is a pulse plasma.

Optionally, the pulse plasma is generated by applying a pulse high frequency voltage discharge, wherein the pulse power ranges from 2 W to 500 W, the pulse frequency ranges from 10 Hz to 50 kHz, the pulse duty cycle ranges from 0.1% to 80%, and the plasma discharge duration time ranges from 100 s to 20000 s.

A device includes the aforementioned protective coating on at least part of the surface thereof.

The protective coating of the specific embodiment of the present disclosure has strong adhesion to the substrate and excellent wear resistance.

DETAILED DESCRIPTION

The protective coating of the specific embodiment of the present disclosure includes a first coating formed on a surface of a substrate by plasma polymerization deposition when the substrate contacts plasmas, and the plasmas include a plasma of a monomer A and a plasma of a monomer B, wherein the monomer A includes a silicon structural unit of formula (I) and at least one amine group structural unit of formula (II) or formula (III), and the monomer B includes a terminal carboxyl group structural unit.

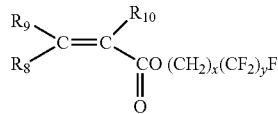

(I)

(II)

(III)

The protective coating of the specific embodiment of the present disclosure is prepared by plasma polymerizing the monomer A including the silicon structural unit of formula (I) and the secondary amine structural unit of formula (II) or the primary amine structural unit of formula (III) and the monomer B including the terminal carboxyl group structure on the surface of the substrate. The protective coating is in strong adhesion to the substrate, and has excellent wear resistance.

According to some specific embodiments of the present disclosure, the structure of the monomer A is shown in formula (IV),

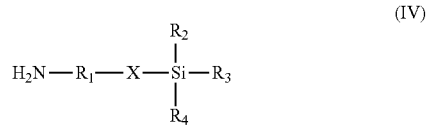

(IV)

wherein X is a connecting bond, an oxygen atom or a carbonyl, $R_1$ is a $C_1$-$C_{10}$ hydrocarbylene or a halogen-substituted $C_1$-$C_{10}$ hydrocarbylene, and $R_2$, $R_3$ and $R_4$ are respectively independently selected from a group consisting of a hydrogen atom, a halogen atom, a $C_1$-$C_{10}$ hydrocarbyl, a halogen-substituted $C_1$-$C_{10}$ hydrocarbyl, a $C_1$-$C_{10}$ hydrocarbyloxy, a halogen-substituted $C_1$-$C_{10}$ hydrocarbyloxy, a $C_1$-$C_{10}$ hydrocarbon acyloxy, and a halogen-substituted $C_1$-$C_{10}$ hydrocarbon acyloxy. According to some specific embodiments of the present disclosure, the hydrocarbylene is a saturated alkylene, such as a methylene, an ethylidene, a propylidene, a butylidene, a pentylidene, a hexylidene, etc. According to some specific embodiments of the present disclosure, the hydrocarbylene is an unsaturated alkenylene, an unsaturated alkynylene or an unsaturated arylene hydrocarbyl. According to some specific embodiments of the present disclosure, the hydrocarbyl is a saturated alkyl, such as methyl, ethyl, propyl, butyl, pentyl, hexyl, etc. According to some specific embodiments of the present disclosure, the hydrocarbyl is an unsaturated alkenyl, alkynyl or aromatic hydrocarbyl. According to some specific embodiments of the present disclosure, the hydrocarbyloxy is a saturated alkoxy, such as methoxy, ethoxy, propoxy, butoxy, pentyloxy, hexoxy, etc. According to some specific embodiments of the present disclosure, the hydrocarbyloxy is an unsaturated alkenyloxy, an unsaturated alkynyloxy, or an unsaturated aryloxy. According to some specific embodiments of the present disclosure, the hydrocarbon acyloxy is a saturated alkyl acyloxy, such as formyloxy, acetoxy, propionyloxy, butyryloxy, valeryloxy, hexanoyloxy, etc. According to some specific embodiments of the present disclosure, the hydrocarbon acyloxy is unsaturated alkenoyloxy, alkynoyloxy or aromatic acyloxy. According to some specific embodiments of the present disclosure, X is a connecting bond, $R_1$ is a $C_1$-$C_{10}$ alkylene, especially an ethylidene, a propylidene or a butylidene, $R_2$, $R_3$ and $R_4$ are respectively independently $C_1$-$C_{10}$ hydrocarbyloxy, especially methoxy, ethoxy or propoxy.

According to some specific embodiments of the present disclosure, the structure of the monomer B is shown in formula (V),

(V)

wherein $R_5$, $R_6$ and $R_7$ are respectively independently selected from a group consisting of a hydrogen atom, a halogen atom, a $C_1$-$C_{10}$ hydrocarbyl, and a halogen-substituted $C_1$-$C_{10}$ hydrocarbyl, and Y is a connecting bond, a $C_1$-$C_{10}$ hydrocarbylene or a halogen-substituted $C_1$-$C_{10}$ hydrocarbylene. According to some specific embodiments of the present disclosure, the hydrocarbylene is a saturated alkylene, such as a methylene, an ethylidene, a propylidene, a butylidene, a pentylidene, a hexylidene, etc. According to some specific embodiments of the present disclosure, the hydrocarbylene is an unsaturated alkenylene, an unsaturated alkynylene or an unsaturated arylene hydrocarbyl. According to some specific embodiments of the present disclosure, the hydrocarbyl is a saturated alkyl, such as methyl, ethyl, propyl, butyl, pentyl, hexyl, etc. According to some specific embodiments of the present disclosure, the hydrocarbyl is an unsaturated alkenyl, alkynyl or aromatic hydrocarbyl. According to some specific embodiments of the present disclosure, $R_5$, $R_6$ and $R_7$ are respectively independently selected from a group consisting of a hydrogen atom and a methyl, in particular, $R_5$ and $R_6$ are hydrogen atoms, $R_7$ is a hydrogen atom or a methyl, and Y is a connecting bond.

According to some specific embodiments of the present disclosure, the substrate is an electronic or electrical component, such as mobile phone, audio equipment, portable computer, printed circuit board (PCB), printed circuit board array (PCBA), transistor, resistor or semiconductor chip, etc. According to some specific embodiments, the substrate is a variety of substrate such as plastic, fabric, glass or metal, etc. According to some specific embodiments, the substrate may include a substrate that has been pretreated on its surface, and the surface pretreatment includes surface cleaning treatment by heat, oxygen or plasma, and other treatment on the to be coated surface.

According to some specific embodiments of the present disclosure, the molar ratio of the monomer A calculated by the amine group structural unit to the monomer B calculated by the terminal carboxyl group structural unit is in a range of 10:0.1 to 1:10. Further, the molar ratio of the monomer A calculated by the amine group structural unit to the monomer B calculated by the terminal carboxyl group structural unit is in a range of 10:0.5 to 1:5, such as 10:0.5, 10:1, 10:2, 10:3, 10:4, 10:5, 10:10, 5:10, etc. The monomer A calculated by amine group structural unit means that the molar quantities of the monomer A is calculated by the molar quantities of the amine group structural unit of formula (II) and formula (III) contained in the monomer A, and the monomer B calculated by the terminal carboxyl group structural unit means that the molar quantities of the monomer B is calculated by the molar quantities of the terminal carboxyl group structural unit contained in the monomer B.

According to some specific embodiments of the present disclosure, the protective coating is the first coating formed on the surface of the substrate by plasma polymerization when the substrate contacts the plasmas of the monomer A and the monomer B. According to some specific embodiments, the protective coating is formed when the substrate contacts the plasmas of the monomer A, the monomer B and other monomers. For example, the plasmas also include the plasma of a monomer C, which includes one or more selected from a group consisting of a fluorohydrocarbon, a fluoroacrylate and a fluorosilane. The coating is formed on the surface of the substrate by plasma polymerizing the monomer A including the silicon structural unit of formula (I) and the secondary amine structural unit of formula (II) or the primary amine structural unit of formula (III), the monomer B including the terminal carboxyl group structure and the fluorocarbon monomer C. With the cooperation of the silicon structural unit, the secondary amine or the primary amine structural unit serving as an active functional group of the monomer A and the terminal carboxyl group structural unit serving as an active functional group of the monomer B, the monomer A, the monomer B and the monomer C can form a three-dimensional mesh plasma polymerization coating which is firmly adhered to the substrate and has excellent wear resistance.

According to some specific embodiments of the present disclosure, as a specific example of the fluorohydrocarbon, it includes one or more selected from a group consisting of fluoroalkane, fluoroalkene and fluoroalkyne. The fluoroalkane includes tetrafluoromethane, hexafluoroethane, octafluoropropane or decafluorobutane, etc. The fluoroalkene includes tetrafluoroethylene, hexafluoropropylene, octafluorobutene, decafluoropentene or 1H, 1H, 2H-perfluoro-1-dodecene, etc. The fluoroalkyne includes difluoroacetylene, tetrafluoropropyne or hexafluorobutyne, etc.

According to some specific embodiments of the present disclosure, particularly, the monomer C is preferred to be a fluoroacrylate shown in formula (VI) below.

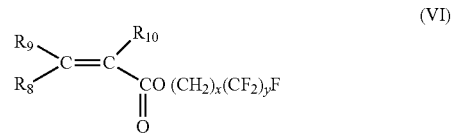

(VI)

In formula (VI), $R_8$, $R_9$ and $R_{10}$ are respectively independently selected from a group consisting of a hydrogen atom, a halogen atom, a $C_1$-$C_{10}$ hydrocarbyl, and a halogen-substituted $C_1$-$C_{10}$ hydrocarbyl, x is an integer of 0, 1 or 2, and y is 1, 2, 3, 4, 5, 6, 7, 8, 9, 10, 11, 12, 13, 14, 15, 16, 17, 18, 19 or 20. According to some specific embodiments of the present disclosure, the hydrocarbyl is a saturated alkyl, such as methyl, ethyl, propyl, butyl, pentyl, hexyl, etc. According to some specific embodiments of the present disclosure, the hydrocarbyl is an unsaturated alkenyl, alkynyl or aromatic hydrocarbyl. According to some specific embodiments of the present disclosure, $R_8$, $R_9$ and $R_{10}$ are respectively independently selected from a group consisting of a hydrogen atom and a methyl.

According to some specific embodiments of the present disclosure, the molar ratio of the sum of the monomer A and the monomer B to the monomer C is in a range of 1:20 to 20:1. Particularly, taking into consideration of both the protective performance and wear resistance, the molar ratio of the sum of the monomer A and the monomer B to the monomer C is in a range of 1:5 to 5:1, and further is in a range of 1:0.5 to 1:3.5.

According to some specific embodiments of the present disclosure, the protective coating further includes a second coating on the first coating. The second coating includes one or more layers of plasma polymerization coatings, and the monomers of each layer of the second coating are respectively independently one or more selected from a group consisting of a fluorohydrocarbon, a fluoroacrylate and a fluorosilane. According to some specific embodiments, the protective coating also includes two or more layers of plasma polymerization second coating, such as two layers, three layers or four layers, formed on the first coating formed by plasma polymerization of the monomer A and the monomer B. The monomers of each of the two or more layers of the plasma polymerization second coating are respectively independently one or more selected from a group consisting of a fluorohydrocarbon, a fluoroacrylate and a fluorosilane. The fluorine atom content of the monomers of an outer layer of plasma polymerization coating is higher than that of an inner layer of plasma polymerization coating. In this way, it is more beneficial to form a hydrophobic protective coating of strong adhesion and wear resistance. The fluorine atom content refers to the proportion of the quantities of fluorine atoms in the total quantities of atoms in the monomer. Specifically, for example, a plasma polymerization second coating of 2-(perfluoropropyl) ethyl acrylate and a plasma polymerization second coating of 2-perfluorooctyl acrylate are successively formed on the first coating formed by plasma polymerization of the monomer A and the monomer B. According to some specific embodiments of the present disclosure, the fluorohydrocarbon, fluoroacrylate or fluorosilane are those described above.

According to some specific embodiments of the present disclosure, the protective coating is formed by plasma polymerization, and the thickness of the coating is of nanoscale. According to some specific embodiments, the thickness of the protective coating ranges from 1 nm to 1000 nm.

According to some specific embodiments of the present disclosure, a preparation method of the aforementioned protective coating is provided, which includes: gasifying the monomers including the monomer A and the monomer B and introducing the monomers into a plasma reactor, performing a plasma discharge, and forming the first coating on the surface of the substrate by plasma polymerization.

According to some specific embodiments of the present disclosure, the monomers also include the monomer C, which includes one or more selected from a group consisting of a fluorohydrocarbon, a fluoroacrylate and a fluorosilane. According to some specific embodiments, the monomer A, the monomer B and the monomer C are respectively gasified and then introduced into the plasma reactor. According to some specific embodiments, the monomer A and the monomer B are mixed before gasification, thereby being beneficial to the reaction between the amine group of the monomer A and carboxyl of the monomer B, and forming the protective coating with a better protective performance.

According to some specific embodiments of the present disclosure, the preparation method also includes forming a second coating by plasma polymerization on the first coating formed by plasma polymerization of the monomer A and the monomer B. The second coating includes one or more layers of plasma polymerization coatings. The monomers of each layer of the second coating are respectively independently one or more selected from a group consisting of a fluorohydrocarbon, a fluoroacrylate and a fluorosilane.

According to some specific embodiments of the present disclosure, the relevant descriptions of the monomer A, the monomer B, the monomer C, fluorohydrocarbon, fluoroacrylate or fluorosilane and the substrate are shown above.

According to some specific embodiments of the present disclosure, the plasma polymerization uses continuous plasma. According to some specific embodiments, in order to obtain better wear resistance, the plasma polymerization uses pulse plasma. According to some specific embodiments, the following pulse plasma polymerization process is performed: placing the substrate in a reaction chamber, vacuumizing the chamber to 1 mTorr to 100 Torr, introducing the reaction monomers in the form of vapor by heating into the chamber, introducing the inert gas helium, and turning on the power to generate plasma, thereby resulting in a chemical vapor deposition on the surface of the substrate. The temperature in the chamber is controlled in a range of 20° C. to 60° C., the monomer gasification temperature is in a range of 70° C. to 150° C., and the gasification occurs under a vacuum condition. The flow rate of the monomer ranges from 10 μL/min to 1000 μL/min, especially from 100 μL/min to 200 μL/min. The plasma discharge mode is radio frequency pulse discharge, and the power ranges from 2 W to 500 W, especially from 50 W to 200 W. The pulse frequency ranges from 10 Hz to 50 kHz, especially from 50 Hz to 500 Hz. The pulse duty cycle ranges from 0.1% to 80%, especially from 0.1% to 1%. The plasma discharge duration time ranges from 100 s to 20000 s, especially from 500 s to 5000 s. According to some specific embodiments of the present disclosure, the plasma discharge mode may include radio frequency discharge, microwave discharge, intermediate frequency discharge, or electric spark discharge, and the like.

A device is also provided by some specific embodiments of the present disclosure. At least part of the surface of the device has any of the aforementioned protective coating. According to some specific embodiments, only the aforementioned protective coating is deposited on part of or all of the surface of the device. According to some specific embodiments, the aforementioned protective coating and other coating are deposited on part of or all of the surface of the device.

The present disclosure is further described in the following specific embodiments.

Embodiment 1-1

Solution One

Three circuit boards including a circuit board 1, a circuit board 2 and a circuit board 3 were placed in a plasma chamber, the chamber was vacuumized continuously to 5 mTorr, and helium gas was introduced at a flow rate of 40 sccm. The pulse discharge was turned on to generate plasma, the power was 180 W, the pulse duty cycle was 15%, and the pulse frequency was 500 Hz. A monomer of 3-aminopropyltrimethoxysilane and a monomer of methacrylic acid were mixed at a molar ratio of 10:1, and then gasified at a temperature of 85° C. and introduced into the chamber for plasma chemical vapor polymerization deposition. The flow rate of the monomers was 150 μL/min, and the reaction duration time was 1800 s. Then a monomer of 2-(perfluoropropyl) ethyl acrylate was introduced at a gasification temperature of 90° C. The pulse discharge power was adjusted to 33 W, the pulse duty cycle was 15%, the pulse frequency was 500 Hz, the flow rate of the monomer was 180 μL/min, and the reaction duration time was 3600 s. Then, a monomer of 2-perfluorooctyl ethyl acrylate was introduced at a gasification temperature of 80° C. The power was 180 W, the pulse duty cycle was 0.3%, the pulse frequency was 50 Hz, the flow rate of the monomer was 110 μL/min, and the reaction duration time was 1000 s. After the discharge, the compressed air was introduced to restore the chamber to normal pressure. The chamber was opened, and the circuit boards were taken out.

Solution Two

Three circuit boards including a circuit board 1', a circuit board 2' and a circuit board 3' were placed in a plasma chamber, the chamber was vacuumized continuously to 5 mTorr, and helium gas was introduced at a flow rate of 40 sccm. The pulse discharge was turned on to generate plasma. A monomer of 2-(perfluoropropyl) ethyl acrylate was introduced at a gasification temperature of 90° C., the power was 33 W, the pulse duty cycle was 15%, the pulse frequency was 500 Hz, the flow rate of the monomer was 180 μL/min, and the reaction duration time was 3600 s. Then, a monomer of 2-perfluorooctyl ethyl acrylate was introduced at a gasification temperature of 80° C., the power was 180 W, the pulse duty cycle was 0.3%, the pulse frequency was 50 Hz, the flow rate of the monomer was 110 μL/min, and the reaction duration time was 1000 s. After the discharge, the compressed air was introduced to restore the chamber to normal pressure, the chamber was opened, and the circuit boards were taken out.

The circuit boards of Solution one and Solution two were tested for wear resistance by a wear resistance tester, the friction material was a dust-free cloth, the applied load was 100 g, the rotation speed was 50 r/min and the friction was performed for 50 times. After friction, a water soaking verification was performed. The water soaking verification process was as follows: 1. The power supply provided 5V voltage for the circuit boards; 2. the circuit boards were soaked in water; 3. the electric current was detected by a computer; 4. the failure time (electric current>0.6 mA) was recorded or the test time reached 13 min.

The test results are as follows:

| Coating Design | Circuit Board | Thickness of Coating | Underwater Power Supply (5 V) | Test Result |
|---|---|---|---|---|
| Solution one | circuit board 1 | 500 nm | 13 min | electric current was 0.35 mA |
| | circuit board 2 | 502 nm | 12 min | no electric current was detected |
| | circuit board 3 | 505 nm | 11 min | no electric current was detected |
| Solution two | circuit board 1' | 460 nm | 0 min | electric current was greater than 0.6 mA once soaked in water |
| | circuit board 2' | 463 nm | 0 min | electric current was greater than 0.6 mA once soaked in water |
| | circuit board 3' | 462 nm | 0 min | electric current was greater than 0.6 mA once soaked in water |

It can be seen that, after friction, no electric current was detected when the circuit boards of Solution one were powered underwater for no more than 12 min, while the circuit boards of Solution two generated a large electric current when put into water, indicating that the coating of Solution one has better wear resistance than that of Solution two.

Embodiment 1-2

Solution One

An aluminum alloy board was placed in a plasma chamber, the chamber was vacuumized continuously to 5 mTorr, and helium gas was introduced at a flow rate of 40 sccm. The pulse discharge was turned on to generate plasma, the power was 200 W, the pulse duty cycle was 25%, and the pulse frequency was 700 Hz. A monomer of 3-aminopropyltrimethoxysilane and a monomer of methacrylic acid were mixed at a molar ratio of 3:1, and then gasified at a temperature of 85° C. and introduced into the chamber for plasma chemical vapor deposition. The flow rate of the monomers was 180 μL/min, and the reaction duration time was 1800 s. Then a monomer of 2-(perfluorooctyl) ethyl acrylate was introduced at a gasification temperature of 80° C., the power was 180 W, the pulse duty cycle was 0.3%, the pulse frequency was 50 Hz, the flow rate of the monomer was 110 μL/min, and the reaction duration time was 3600 s. After the discharge, the compressed air was introduced to restore the chamber to normal pressure, the chamber was opened, and the aluminum alloy board was taken out.

Solution Two

An aluminum alloy board was placed in a plasma chamber, the chamber was vacuumized continuously to 5 mTorr, and helium gas was introduced at a flow rate of 40 sccm. The pulse discharge was turned on to generate plasma. A monomer of 2-(perfluorooctyl) ethyl acrylate was introduced at a gasification temperature of 80° C., the power was 180 W, the pulse duty cycle was 0.3%, the pulse frequency was 50 Hz, the flow rate of the monomer was 110 μL/min, and the reaction duration time was 5400 s. After the discharge, the compressed air was introduced to restore the chamber to normal pressure, the chamber was opened, and the aluminum alloy board was taken out.

The aluminum alloy boards of Solution one and Solution two were tested for wear resistance, the friction material was a steel wool, the applied load was 1 kg, the rotation speed was 60 r/min, and the water contact angle was recorded every 500 times of friction until the water contact angle was less than 100°.

The test results are as follows:

|  | Water Contact Angle | | | | | | |
| --- | --- | --- | --- | --- | --- | --- | --- |
| Samples | 0 time | 500 times | 1000 times | 1500 times | 2000 times | 2500 times | 3000 times |
| Solution one | 121° | 117° | 114° | 105° | 103° | 103° | 100° |
| Solution two | 120° | 110° | 99° | / | / | / | / |

It can be seen that, after the aluminum alloy board of Solution one was rotated to be rubbed for 3000 times, the water contact angle was still 100°, while when the aluminum alloy board of Solution two was rotated to be rubbed for 1000 times, the water contact angle was less than 100°, indicating that the coating of Solution one has better wear resistance.

Embodiment 1-3

Solution One

A mobile phone screen was placed in a plasma chamber, the chamber was vacuumized continuously to 5 mTorr, and helium gas was introduced at a flow rate of 40 sccm. The pulse discharge was turned on to generate plasma, the power was 180 W, the pulse duty cycle was 10%, and the pulse frequency was 300 Hz. A monomer of 3-aminopropyltrimethoxysilane and a monomer of methacrylic acid were mixed at a molar ratio of 1:1, gasified at a temperature of 85° C. and introduced into the chamber for plasma chemical vapor deposition. The flow rate of the monomers was 180 μL/min, and the reaction duration time was 1800 s. Then a monomer of (2H-perfluorobutyl)-2-acrylate was introduced at a gasification temperature of 85° C., the power was 180 W, the pulse duty cycle was 0.3%, the pulse frequency was 50 Hz, the flow rate of the monomer was 110 μL/min, and the reaction duration time was 3600 s. After the discharge, the compressed air was introduced to restore the chamber to normal pressure, the chamber was opened, and the mobile phone screen was taken out.

Solution Two

A mobile phone screen was placed in a plasma chamber, the chamber is vacuumized continuously to 5 mTorr, and helium gas was introduced at a flow rate of 40 sccm. The pulse discharge was turned on to generate plasma, the power was 180 W, the pulse duty cycle was 0.3%, and the pulse frequency was 50 Hz. A monomer of (2H-perfluorobutyl)-2-acrylate was gasified at a temperature of 85° C. and introduced into the chamber for plasma chemical vapor deposition, the flow rate of the monomer was 180 μL/min, and the reaction duration time was 5400 s. After the discharge, the compressed air was introduced to restore the chamber to normal pressure, the chamber was opened, and the mobile phone screen was taken out.

The mobile phone screens of Solution one and Solution two were tested for wear resistance, the friction material was a dust-free cloth, the applied load was 500 g, the rotation speed was 60 r/min, and the water contact angle was recorded every 500 times of friction until the water contact angle was less than 100°.

The test results are as follows:

|  | Water Contact Angle | | | | |
| --- | --- | --- | --- | --- | --- |
| Samples | 0 time | 500 times | 1000 times | 1500 times | 2000 times |
| Solution one | 118° | 113° | 108° | 103° | 100° |
| Solution two | 115° | 106° | 95° | / | / |

It can be seen that, after the mobile phone screen of Solution one was rotated to be rubbed for 2000 times, the water contact angle was still 100°, while when the mobile phone screen of Solution two was rotated to be rubbed for 1000 times, the water contact angle was less than 100°, indicating that the coating of Solution one has better wear resistance.

Embodiment 1-4

Two mobile phone protective shells were placed in the plasma chamber, and other conditions were consistent with Embodiment 1-3.

The mobile phone protective shells were tested for wear resistance, the friction material was an eraser, the applied load was 500 g, the rotation speed was 60 r/min, and the water contact angle was recorded every 500 times of friction until the water contact angle was less than 100°.

The test results are as follows:

| Samples | Water Contact Angle | | | | | |
|---|---|---|---|---|---|---|
| | 0 time | 500 times | 1000 times | 1500 times | 2000 times | 2500 times |
| Solution one | 116° | 116° | 107° | 102° | 101° | 98° |
| Solution two | 115° | 112° | 104° | 98° | / | / |

It can be seen that, after the mobile phone protective shell of Solution one was rotated to be rubbed for 2000 times, the water contact angle was still 101°, while when the mobile phone protective shell of Solution two was rotated to be rubbed for 1500 times, the water contact angle was less than 100°, indicating that the coating of Solution one has better wear resistance.

Embodiment 2-1

Solution One

A circuit board 1, a circuit board 2 and a circuit board 3 were placed in a plasma chamber, the chamber was vacuumized to 8 mTorr, and helium gas was introduced at a flow rate of 40 sccm. The plasma discharge was turned on, the power was 200 W, the pulse duty cycle was 25%, and the pulse frequency was 500 Hz. 3-aminopropyltrimethoxysilane and methacrylic acid were mixed, gasified and introduced into the plasma chamber, while 2-perfluorooctyl ethyl acrylate was gasified and introduced into the plasma chamber. The molar ratio of 3-aminopropyltrimethoxysilane to methacrylic acid to 2-perfluorooctyl ethyl acrylate was 10:1:33, the flow rate was 220 μL/min, and the coating time was 7200 s. After coating, the compressed air was introduced to restore the chamber to normal pressure, and the circuit boards were taken out.

Solution Two

A circuit board 1', a circuit board 2' and a circuit board 3' were placed in a plasma chamber, the chamber was vacuumized to 8 mTorr, and helium gas was introduced at a flow rate of 40 sccm. The plasma discharge was turned on, the power was 200 W, the pulse duty cycle was 25%, and the pulse frequency was 500 Hz. A monomer of 2-perfluorooctyl ethyl acrylate was gasified and introduced into the plasma chamber, the flow rate was 220 μL/min, and the coating time was 7200 s. After coating, the compressed air was introduced to restore the chamber to normal pressure, and the circuit boards were taken out.

The circuit boards of Solution one and Solution two were tested for wear resistance by a wear resistance tester, the friction material was a dust-free cloth, the applied load was 100 g, the rotation speed was 50 r/min and the friction was performed for 50 times. After friction, a water soaking verification was performed. The water soaking verification process was as follows: 1. The power supply provided a voltage for the circuit boards; 2. the circuit boards were soaked in water; 3. the electric current was detected by a computer; 4. the failure time (electric current>0.6 mA) was recorded or the test time reached 13 min.

The test results are as follows:

| Coating Design | Circuit Board | Thickness of Coating | Failure Time of Underwater Power Supply (5 V) |
|---|---|---|---|
| Solution one | 1 | 500 nm | 12 min |
| | 2 | | 10 min |
| | 3 | | 8 min |
| Solution two | 1' | 500 nm | 1 min |
| | 2' | | 0 min |
| | 3' | | 0 min |

It can be seen that, after friction the failure time of underwater powered circuit boards of Solution one was much longer than that of Solution two, indicating that the coating of Solution one has better wear resistance than that of Solution two.

Embodiment 2-2

Solution One

A flexible substrate sample was placed in a plasma chamber, the chamber was vacuumized to 5 mTorr, and helium gas was introduced at a flow rate of 40 sccm. The plasma discharge was turned on, the power was 25 W, the pulse duty cycle was 35%, and the pulse frequency was 700 Hz. 3-aminopropyltrimethoxysilane and methacrylic acid were mixed, gasified and introduced into the plasma chamber, 1H,1H,2H,2H-perfluorooctanol acrylate was gasified and introduced into the plasma chamber. The molar ratio of 3-aminopropyltrimethoxysilane to methacrylic acid to 1H,1H,2H,2H-perfluorooctanol acrylate was 10:2:20, the flow rate was 220 μL/min, and the coating time was 4300 s. After coating, the compressed air was introduced to restore the chamber to normal pressure, and the flexible substrate sample was taken out.

Solution Two

A flexible substrate sample was placed in a plasma chamber, the chamber was vacuumized to 5 mTorr, and helium gas was introduced at a flow rate of 40 sccm. The plasma discharge was turned on, the power was 25 W, the pulse duty cycle was 35%, and the pulse frequency was 700 Hz. A monomer of 1H,1H,2H,2H-perfluorooctanol acrylate was gasified and introduced into the plasma chamber, the flow rate was 220 L/min, and the coating time was 4300 s. After coating, the compressed air was introduced to restore the chamber to normal pressure, and the flexible substrate sample was taken out.

The flexible substrate samples of Solution one and Solution two were bent for 100 times in the same way. There was no obvious change in the coating on the surface of the bent part of the sample of Solution one, and the surface of the bent part was consistent with the surface of the non bent part. The coating on the surface of the sample of Solution two had a peeling.

Embodiment 2-3

Solution One

FPC (Flexible printed circuit board) sample 1, FPC sample 2 and FPC sample 3 were placed in a plasma chamber, the chamber was vacuumized to 6 mTorr, and helium gas was introduced at a flow rate of 45 sccm. The plasma discharge was turned on, the power was 180 W, the pulse duty cycle was 35%, and the pulse frequency was 300 Hz. 3-aminopropyltrimethoxysilane and methacrylic acid were mixed, gasified, and introduced into the plasma chamber, while 2-perfluorooctyl ethyl acrylate was gasified and introduced into the plasma chamber. The molar ratio of 3-aminopropyltrimethoxysilane to methacrylic acid to 2-perfluorooctyl ethyl acrylate was 10:2:36, the flow rate was 200 μL/min, and the coating time was 7200 s. After coating, the compressed air was introduced to restore the chamber to normal pressure, and the FPC samples were taken out.

Solution Two

FPC sample 1', FPC sample 2' and FPC sample 3' were placed in a plasma chamber, the chamber was vacuumized to 6 mTorr, and helium gas was introduced at a flow rate of 45 sccm. The plasma discharge was turned on, the power was 180 W, the pulse duty cycle was 35%, and the pulse frequency was 300 Hz. A monomer of 2-perfluorooctyl ethyl acrylate was gasified and introduced into the plasma chamber, the flow rate was 200 μL/min, and the coating time was 7200 s. After coating, the compressed air was introduced to restore the chamber to normal pressure, and the FPC samples were taken out.

The FPC samples of Solution one and Solution two were bent for 10 times in the same way and then soaked in water for testing. The water soaking test method was the same as that in Embodiment 2-1. The test condition was: the failure time (the electric current was greater than 20 μA) was recorded or the test time reached 30 min.

The test results are as follows:

| Coating Design | Thickness of Coating | FPC Sample | Underwater Power Supply (5 V) | Test Result |
|---|---|---|---|---|
| Solution one | 600 nm | 1 | 30 min | electric current did not reach 20 μA |
| | | 2 | 30 min | |
| | | 3 | 30 min | |
| Solution two | 600 nm | 1' | 15 min | electric current reached 20 μA |
| | | 2' | 18 min | |
| | | 3' | 9 min | |

It can be seen that, after being bent for multiple times the electric current of FPC samples of Solution one did not reach 20 μA after being powered underwater for 30 min, while the electric current of the FPC samples of Solution two reached 20 μA after being powered underwater within 15 min. It indicates that the coating of Solution one has better bending resistance than that of Solution two.

Embodiment 2-4

Solution One

TYPE-C male and female connectors 1, TYPE-C male and female connectors 2 and TYPE-C male and female connectors 3 were placed in a plasma chamber, the chamber was vacuumized to 8 mTorr, and helium gas was introduced at a flow rate of 40 sccm. The plasma discharge was turned on, the power was 200 W, the pulse duty cycle was 25%, and the pulse frequency was 50 Hz. 3-aminopropyltrimethoxysilane and acrylic acid were mixed, gasified, and introduced into the plasma chamber, while 1H,1H,2H,2H-perfluorooctanol acrylate was gasified and introduced into the plasma chamber. The molar ratio of 3-aminopropyltrimethoxysilane to acrylic acid to 1H,1H,2H,2H-perfluorooctanol acrylate was 10:2:36, the flow rate was 220 μL/min, and the coating time was 2000 s. After coating, the compressed air was introduced to restore the chamber to normal pressure, and the TYPE-C male and female connectors samples were taken out.

Solution Two

TYPE-C male and female connectors 1', TYPE-C male and female connectors 2' and TYPE-C male and female connectors 3' were placed in a plasma chamber, the chamber was vacuumized to 8 mTorr, and helium gas was introduced at a flow rate of 40 sccm. The plasma discharge was turned on, the power was 200 W, the pulse duty cycle was 25%, and the pulse frequency was 50 Hz. A monomer of 1H,1H,2H,2H-perfluorooctanol acrylate was gasified and introduced into the plasma chamber at a flow rate of 220 μL/min, and the coating time was 2000 s. After coating, the compressed air was introduced to restore the chamber to normal pressure, and the TYPE-C male and female connectors samples were taken out.

The TYPE-C male and female connectors of Solution one and Solution two were tested by being plugged and unplugged for 50 times. After the test, the power supply was turned on for test. The failure time (electric current greater than 0.1 A) was recorded or the test was stopped when the test time reached 1 hour.

The test results are as follows:

| Coating Design | Thickness of Coating | TYPE-C male and female connectors | Underwater Power Supply (20 V) | Test Result |
|---|---|---|---|---|
| Solution one | 100 nm | 1 | 1 h | electric current did not reach 0.1 A |
| | | 2 | 1 h | |
| | | 3 | 1 h | |
| Solution two | 100 nm | 1' | 45 min | electric current reached 0.1 A |
| | | 2' | 30 min | |
| | | 3' | 48 min | |

It can be seen that, after friction the electric current of TYPE-C male and female connectors of Solution one did not reach 0.1 A after being powered underwater for 1 h, while the electric current of TYPE-C male and female connectors of Solution two reached 0.1 A after being powered underwater within 48 min. It indicates that the coating of Solution one has better wear resistance than that of Solution two.

Embodiment 2-5

Solution One

A circuit board 1, a circuit board 2 and a circuit board 3 were placed in a plasma chamber, the chamber was vacuumized to 8 mTorr, and helium gas was introduced at a flow rate of 40 sccm. The plasma discharge was turned on, the power was 200 W, the pulse duty cycle was 15%, and the pulse frequency was 500 Hz. 3-aminopropyltrimethoxysilane, methacrylic acid and 2-(perfluorobutyl) ethyl acrylate were respectively gasified and introduced into the plasma chamber. The molar ratio of 3-aminopropyltrimethoxysilane to methacrylic acid to 2-(perfluorobutyl) ethyl acrylate was 1:1:2, the flow rate was 220 μL/min, and the coating time was 7200 s. After coating, the compressed air was introduced to restore the chamber to normal pressure, and the circuit boards were taken out.

Solution Two

A circuit board 1', a circuit board 2' and a circuit board 3' were placed in a plasma chamber, the chamber was vacuumized to 8 mTorr, and helium gas was introduced at a flow rate of 40 sccm. The plasma discharge was turned on, the power was 200 W, the pulse duty cycle was 15%, and the pulse frequency was 500 Hz. A monomer of 2-(perfluorobutyl) ethyl acrylate was gasified and introduced into the plasma chamber, the flow rate was 220 μL/min, and the coating time was 7200 s. After coating, the compressed air was introduced to restore the chamber to normal pressure, and the circuit boards were taken out.

The circuit boards of Solution one and Solution two were tested for wear resistance by a wear resistance tester, the friction material was a dust-free cloth, the applied load was 100 g, the rotation speed was 50 r/min and the friction was performed for 50 times. After friction, a water soaking verification was performed. The water soaking verification process was as follows: 1. The power supply provided a voltage for the circuit boards; 2. the circuit boards were soaked in water; 3. the electric current was detected by a computer; 4. the failure time (electric current>0.6 mA) was recorded or the test time reached 13 min.

The test results are as follows:

| Coating Design | Circuit Board | Thickness of Coating | Failure Time of Underwater Power Supply (5 V) |
|---|---|---|---|
| Solution one | 1 | 500 nm | 5 min |
|  | 2 |  | 4 min |
|  | 3 |  | 5 min |
| Solution two | 1' | 500 nm | 1 min |
|  | 2' |  | 1 min |
|  | 3' |  | 0 min |

It can be seen that, after friction the failure time of underwater powered circuit boards of Solution one was much longer than that of Solution two, indicating that the coating of Solution one has better wear resistance than that of Solution two.

Although the present disclosure has been disclosed above, the disclosure is not limited hereto. Those skilled in the art can modify and vary the embodiments without departing from the spirit and scope of the present disclosure. Therefore, the scope of protection of the present disclosure shall be subject to the scope defined in claims.

What is claimed is:

1. A protective coating, comprising a first coating formed on a surface of a substrate by plasma polymerization deposition when the substrate contacts plasmas, and the plasmas comprise a plasma of a monomer A and a plasma of a monomer B, wherein the monomer A comprises a silicon structural unit of formula (I) and at least one amine group structural unit of formula (II) or formula (III), and the monomer B comprises a terminal carboxyl group structural unit

(I)

—NH— (II)

—NH$_2$ (III)

wherein the plasmas also comprise a plasma of a monomer C, and the monomer C comprises one or more selected from a group consisting of a fluorohydrocarbon, a fluoroacrylate and a fluorosilane; or wherein the protective coating further comprises: a second coating on the first coating, the second coating comprises one or more layers of plasma polymerization coatings, and monomers of each layer of the second coating are respectively independently one or more selected from a group consisting of a fluorohydrocarbon, a fluoroacrylate and a fluorosilane.

2. The protective coating according to claim 1, wherein a structure of the monomer A is shown in formula (IV), wherein X is a connecting bond, an oxygen atom or a carbonyl, $R_1$ is a $C_1$-$C_{10}$ hydrocarbylene or

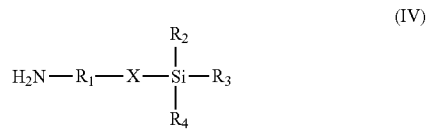
(IV)

a halogen-substituted $C_1$-$C_{10}$ hydrocarbylene, and $R_2$, $R_3$ and $R_4$ are respectively independently selected from a group consisting of a hydrogen atom, a halogen atom, a $C_1$-$C_{10}$ hydrocarbyl, a halogen-substituted $C_1$-$C_{10}$ hydrocarbyl, a $C_1$-$C_{10}$ hydrocarbyloxy, a halogen-substituted $C_1$-$C_{10}$ hydrocarbyloxy, a $C_1$-$C_{10}$ hydrocarbon acyloxy, and a halogen-substituted $C_1$-$C_{10}$ hydrocarbon acyloxy.

3. The protective coating according to claim 2, wherein X is a connecting bond, $R_1$ is a $C_1$-$C_{10}$ alkylene, and $R_2$, $R_3$ and $R_4$ are respectively independently a $C_1$-$C_{10}$ hydrocarbyloxy.

4. The protective coating according to claim 3, wherein $R_1$ is an ethylidene, a propylidene or a butylidene, and $R_2$, $R_3$ and $R_4$ are respectively independently selected from a group consisting of a methoxy, an ethoxy and a propoxy.

5. The protective coating according to claim 1, wherein a structure of the monomer B is shown in formula (V),

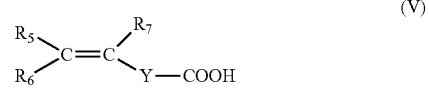
(V)

wherein $R_5$, $R_6$ and $R_7$ are respectively independently selected from a group consisting of a hydrogen atom, a halogen atom, a $C_1$-$C_{10}$ hydrocarbyl, and a halogen-substituted $C_1$-$C_{10}$ hydrocarbyl, and Y is a connecting bond, a $C_1$-$C_{10}$ hydrocarbylene or a halogen-substituted $C_1$-$C_{10}$ hydrocarbylene.

6. The protective coating according to claim 5, wherein $R_5$, $R_6$ and $R_7$ are respectively independently selected from a group consisting of a hydrogen atom and a methyl, and Y is a connecting bond.

7. The protective coating according to claim 6, wherein $R_5$ and $R_6$ are hydrogen atoms, and $R_7$ is a hydrogen atom or a methyl.

8. The protective coating according to claim 1, wherein the substrate is an electronic or electrical component or a metal.

9. The protective coating according to claim 1, wherein a molar ratio of the monomer A calculated by the amine group structural unit to the monomer B calculated by the terminal carboxyl group structural unit is in a range of 10:0.1 to 1:10.

10. The protective coating according to claim 1, wherein a molar ratio of the monomer A calculated by the amine group structural unit to the monomer B calculated by the terminal carboxyl group structural unit is in a range of 10:0.5 to 1:5.

11. The protective coating according to claim 1, wherein a molar ratio of a sum of the monomer A and the monomer B to the monomer C is in a range of 1:20 to 20:1.

12. The protective coating according to claim 11, wherein the molar ratio of the sum of the monomer A and the monomer B to the monomer C is in a range of 1:5 to 5:1.

13. The protective coating according to claim 1, wherein the second coating comprises two or more layers of plasma polymerization coatings, wherein a fluorine atom content of monomers of an outer layer of plasma polymerization coating is higher than a fluorine atom content of monomers of an inner layer of plasma polymerization coating.

14. The protective coating according to claim 1, wherein the fluorohydrocarbon comprises one or more selected from a group consisting of a fluoroalkane, a fluoroalkene and a fluoroalkyne.

15. The protective coating according to claim 1, wherein a structure of the fluoroacrylate is shown in formula (VI), wherein $R_8$, $R_9$ and $R_{10}$ are respectively independently selected from a group consisting of a

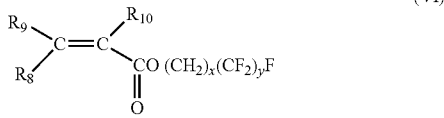 (VI)

hydrogen atom, a halogen atom, a $C_1$-$C_{10}$ hydrocarbyl, and a halogen-substituted $C_1$-$C_{10}$ hydrocarbyl, x is an integer ranging from 0 to 2, and y is an integer ranging from 1 to 20.

16. The protective coating according to claim 15, wherein $R_8$, $R_9$ and $R_{10}$ are respectively independently selected from a group consisting of a hydrogen atom and a methyl.

17. A preparation method of the protective coating of claim 1, comprising:
providing a substrate; and
gasifying monomers comprising the monomer A and the monomer B and introducing the monomers into a plasma reactor, gasifying and introducing the monomer C into the plasma reactor, performing a plasma discharge, and forming the first coating on the surface of the substrate by plasma polymerization; or
gasifying monomers comprising the monomer A and the monomer B and introducing the monomers into a plasma reactor, performing a plasma discharge, and forming the first coating on the surface of the substrate by plasma polymerization; and forming the second coating on the first coating by plasma polymerization, wherein the second coating comprises one or more layers of plasma polymerization coatings, and monomers of each layer of the second coating are respectively independently one or more selected from a group consisting of a fluorohydrocarbon, a fluoroacrylate and a fluorosilane.

18. The preparation method according to claim 17, wherein the monomer A and the monomer B are mixed before gasification.

19. The preparation method according to claim 17, wherein the plasma is a pulse plasma, and the pulse plasma is generated by applying a pulse high frequency voltage discharge; wherein a pulse power ranges from 2 W to 500 W, a pulse frequency ranges from 10 Hz to 50 kHz, a pulse duty cycle ranges from 0.1% to 80%, and a plasma discharge duration time ranges from 100s to 20000s.

20. A device, wherein the device comprises the protective coating as claimed in claim 1 on at least part of the surface thereof.

* * * * *